United States Patent
Bamji

(10) Patent No.: US 10,453,877 B2
(45) Date of Patent: *Oct. 22, 2019

(54) CMOS THREE-DIMENSIONAL IMAGE SENSOR DETECTORS HAVING REDUCED INTER-GATE CAPACITANCE, AND ENHANCED MODULATION CONTRAST

(71) Applicant: Microsoft Technology Licensing, LLC, Redmond, WA (US)

(72) Inventor: Cyrus Bamji, Fremont, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 309 days.

This patent is subject to a terminal disclaimer.

(21) Appl. No.: 15/421,821

(22) Filed: Feb. 1, 2017

(65) Prior Publication Data
US 2017/0148830 A1 May 25, 2017

Related U.S. Application Data

(60) Continuation of application No. 14/449,800, filed on Aug. 1, 2014, now Pat. No. 9,595,550, which is a (Continued)

(51) Int. Cl.
*H01L 27/146* (2006.01)
*G01S 7/486* (2006.01)
(Continued)

(52) U.S. Cl.
CPC ......... *H01L 27/14605* (2013.01); *G01J 1/42* (2013.01); *G01S 7/4861* (2013.01);
(Continued)

(58) Field of Classification Search
CPC ........ G01S 7/4816; G01S 17/08; G01S 17/36; G01S 17/89; H01L 27/0805; G01J 3/50
See application file for complete search history.

(56) References Cited

U.S. PATENT DOCUMENTS

| 7,532,196 B2 | 5/2009 | Hinckley |
| 8,587,771 B2 | 11/2013 | Xu et al. |

(Continued)

FOREIGN PATENT DOCUMENTS

CN 105283823 A 1/2016

OTHER PUBLICATIONS

Requirement for Restriction/Election in U.S. Appl. No. 12/658,806 dated Sep. 25, 2012.
(Continued)

*Primary Examiner* — Luke D Ratcliffe
(74) *Attorney, Agent, or Firm* — Alleman Hall Creasman & Tuttle LLP

(57) ABSTRACT

A CMOS detector with pairs of interdigitated elongated finger-like collection gates includes p+ implanted regions that create charge barrier regions that can intentionally be overcome. These regions steer charge to a desired collection gate pair for collection. The p+ implanted regions may be formed before and/or after formation of the collection gates. These regions form charge barrier regions when an associated collection gate is biased low. The barriers are overcome when an associated collection gate is high. These barrier regions steer substantially all charge to collection gates that are biased high, enhancing modulation contrast. Advantageously, the resultant structure has reduced power requirements in that inter-gate capacitance is reduced in that inter-gate spacing can be increased over prior art gate spacing and lower swing voltages may be used. Also higher modulation contrast is achieved in that the charge collection area of the low gate(s) is significantly reduced.

23 Claims, 6 Drawing Sheets

Related U.S. Application Data division of application No. 12/658,806, filed on Feb. 16, 2010, now Pat. No. 8,953,149.

(60) Provisional application No. 61/207,913, filed on Feb. 17, 2009.

(51) Int. Cl.
  G01S 17/89 (2006.01)
  G01J 1/42 (2006.01)

(52) U.S. Cl.
  CPC ............ G01S 7/4863 (2013.01); G01S 17/89 (2013.01); H01L 27/14603 (2013.01); H01L 27/14614 (2013.01); H01L 27/14643 (2013.01)

(56) References Cited

U.S. PATENT DOCUMENTS

| | | | |
|---|---|---|---|
| 9,516,263 | B2 | 12/2016 | Mathew et al. |
| 9,595,550 | B2* | 3/2017 | Bamji .................. G01S 7/4863 |
| 9,727,300 | B2 | 8/2017 | DeLuca et al. |
| 9,880,799 | B1 | 1/2018 | Bertz et al. |
| 2001/0022371 | A1* | 9/2001 | Rhodes ........... H01L 21/823842 257/290 |
| 2006/0128087 | A1* | 6/2006 | Bamji .................. G01S 7/4816 438/199 |
| 2007/0247798 | A1 | 10/2007 | Scott, II |
| 2010/0321275 | A1 | 12/2010 | Hinckley et al. |
| 2011/0292380 | A1* | 12/2011 | Bamji .................. G01S 7/4863 356/141.1 |
| 2015/0338943 | A1 | 11/2015 | Donnelly et al. |
| 2017/0146657 | A1 | 5/2017 | Xu |

OTHER PUBLICATIONS

Response to Election/Restriction in U.S. Appl. No. 12/658,806 dated Oct. 25, 2012.

Non-Final Rejection in U.S. Appl. No. 12/658,806 dated Sep. 9, 2013.

Response to Office Action in U.S. Appl. No. 12/658,806 dated Mar. 10, 2014.

Notice Allowance and Fees Due in U.S. Appl. No. 12/658,806 dated Apr. 23, 2014.

Preliminary Amendment dated Nov. 12, 2014 in U.S. Appl. No. 14/449,800.

Non-Final Rejection dated Aug. 23, 2016 in U.S. Appl. No. 14/449,800.

Amendment dated Oct. 31, 2016 in U.S. Appl. No. 14/449,800.

Notice of Allowance and Fees Due dated Nov. 15, 2016 in U.S. Appl. No. 14/449,800.

"Using the convenient "multi-display" function on Windows 10", Retrieved From: https://www.eizoglobal.com/library/basics/windows-10-multi-display-function/index.html, Apr. 29, 2017, 15 Pages.

"Non Provisional Application Filed in U.S. Appl. No. 15/950,518", filed Apr. 11, 2018, 24 Pages.

* cited by examiner

CMOS THREE-DIMENSIONAL IMAGE SENSOR DETECTORS HAVING REDUCED INTER-GATE CAPACITANCE, AND ENHANCED MODULATION CONTRAST

CLAIM OF PRIORITY

This application is a continuation of U.S. patent application Ser. No. 14/449,800 filed Aug. 1, 2014 which is a divisional of U.S. patent application Ser. No. 12/658,806 filed on Feb. 16, 2010 entitled "Cmos Three-Dimensional Image Sensor Detectors Having Reduced Inter-Gate Capacitance, And Enhanced Modulation Contrast", which claims priority to U.S. Provisional Patent Application No. 61/207,913 filed on Feb. 17, 2009 entitled "Cmos Three-Dimensional Image Sensor Detectors Having Reduced Inter-Gate Capacitance, And Enhanced Modulation Contrast" where the disclosures of all said applications are incorporated herein by reference in their entireties.

BACKGROUND OF THE INVENTION

The invention relates generally to CMOS-implementable image sensors suitable for three-dimensional applications including time-of-flight (TOF) and phase-based TOF range or depth systems. More specifically, the invention is directed to reducing inter-gate capacitance in such sensors, and enhancing modulation contrast.

It is useful at this juncture to briefly describe TOF systems that can benefit from the present invention. FIGS. 1A-1C depict a phase-based TOF system 100 such as described in U.S. Pat. No. 7,352,454 (2008) entitled Methods and Systems for Improved Charge Management for Three-Dimensional and Color Sensing. The '454 patent is assigned to Canesta, Inc. of Sunnyvale, Calif. and is incorporated herein by reference. TOF system 100 such as described in the '454 patent is phase-based and acquires depth distance Z by examining relative phase ($\Phi$) shift between TOF system transmitted optical energy signals $S_1$, and a fraction of such signals $S_2$ reflected from a target object 20 distance z away.

System 100 includes a CMOS fabricatable IC 110 whereon is formed a two-dimensional array 130 of pixel detectors 140, each of which has circuitry 150 for processing detection charge output by the associated detector. IC 110 also includes a microprocessor or microcontroller unit 160, memory 170 (which preferably includes random access memory or RAM and read-only memory or ROM), a high speed distributable clock 180, and various computing and input/output (I/O) circuitry 190. Among other functions, microprocessor or controller unit 160 may perform distance to object and object velocity calculations. IC 100 further includes an oscillator 115 that is controllable by microprocessor 160 and coupled to optical energy emitter 120. Emitter 120 may be a laser diode or LED, with output wavelength of perhaps 800 nm to 850 nm. Emitter 120 may be allow peak power unit whose output is a periodic signal with perhaps 200 mW peak power, and a repetition rate of perhaps 100 MHz. For ease of illustration assume that the emitter output, which may be transmitted through optical system 125 may be represented as $A \cdot \cos(\omega t)$, where waveform period T is given by $T = 2\pi/\omega$. It is understood that $S_1$ may be other than sinusoidal, e.g., perhaps square wave, triangular wave, among other waveforms.

As shown by FIGS. 1B and 1C, there will be a phase shift $\Phi$ due to the time-of-flight (TOF) required for energy transmitted by emitter 120 ($S_1 = \cos(\omega t)$) to traverse distance z to target object 20, and be reflected as return energy $S_2 = A \cdot \cos(\omega t + \Phi)$, where coefficient A may represent brightness of $S_2$. The $S_2$ return energy is detected by a photodetector 140 in array 130, where the array may include perhaps 100×100 or more photodetectors. The phase shift $\Phi$ due to time-of-flight is:

$$\Phi = 2 \cdot \omega \cdot z/C = 2 \cdot (2\pi f) \cdot z/C$$

where C is the speed of light 300,000 Km/sec. Thus, distance z from energy emitter (and from detector array) to the target object is given by:

$$z = \Phi \cdot C/2\omega = \Phi \cdot C/\{2 \cdot (2\pi f)\}$$

In system 100, phase $\Phi$ and distance z preferably are determined by mixing (or homodyning) the signal $S_2 = A \cdot \cos(\omega t + \Phi)$ detected by each pixel detector 140 with the signal driving the optical energy emitter $S_1 = \cos(\omega_t)$. Mixing resulted from differentially modulating the quantum efficiency of the photodetectors in the array. Different banks of photodetectors 140 in sensor array 130 may be quantum efficiency modulated at different phase shifts, e.g., 0°, 90°, 180°, 270°. The signal mixing product $S_1 \cdot S_2$ will be $0.5 \cdot A \cdot \{\cos(2\omega t + \Phi) + \cos(\Phi)\}$ and will have a time average value of $0.5 \cdot A \cdot \cos(\Phi)$. The system output, denoted DATA, can include depth images as well as other acquired information. System 100 requires no moving parts, can be implemented in CMOS, is operable with or without ambient light, and can have many applications including implementing virtual input devices, range finding, gesture recognition systems, object recognition, etc.

Understandably, acquiring accurate depth images will depend upon the nature and quality of the pixel sensors, and their ability to accurately and correctly collect charge generated by incoming optical energy. As described herein, the present invention enables detectors 140 in array 130 to maximize collection of charge useful to creating an accurate depth image, and to minimize collection of charge that would detract from creating an accurate depth image of the rate of collection in the elongated direction.

It is useful to review challenges associated with efficient collection of photon-energy induced charge in a semiconductor substrate to gain a fuller appreciation of the present invention. The '454 patent provides a useful starting point, and will be described briefly with respect to FIGS. 2A-2E, and FIGS. 3A-3B. As more fully described in the '454 patent, preferably detectors 140 collected charge in two stages. The detector structure included multiple finger-shaped poly material gates, denoted A-gates and B-gates, disposed parallel to each other along a y-axis, and spaced-apart a distance much shorter than their length along an x-axis. Elongated charge barrier regions were formed intermediate adjacent A-gates and B-gates to minimize the collection effects of A-gates upon B-gates and vice versa, and thus avoid inter-gate transfer of charge being collected. Detection-generated charge first moved laterally in the X-direction toward a gate biased at a high clock potential at the time. The charge (electrons) only needed to travel locally and the $\delta X$ distance between adjacent elongated gates was small and the electric field intense. Thereafter the charge moved laterally at a slower rate along the length of the finger-shaped gates for final collection and readout.

FIG. 2B depicts a detector 140, based upon embodiments of the 454 patent. Elongated gates G-A and G-B are coupled to receive G-A and G-B bias clock signals that can be synchronously generated, with respect to phase and frequency, from a master clock generator, e.g., 180, which master clock generator also controls TOF system 100 optical energy emitter 120 (see FIG. 1A). As such, frequency of the G-A and G-B bias clock signals need not be identical to frequency of the master clock generator, but they will be synchronously related. Similarly, phase of the G-A and G-B bias clock signals will be synchronously related to the master clock generator signal. One could, of course, use separate generators for each (or some) of these signals if the proper signal relationships were maintained. FIG. 2B is a cross-section of a sensor detector structure 140-1, with a plot of surface potential at the silicon-gate oxide interface versus position along the X-direction. As noted, charge transfer collection gates A (G-A) and charge transfer collection gates B (G-B) preferably are interleaved elongated or finger-shaped gate structures 620. The nomenclature gate A and gate G-A, gate B, and gate B-G may be used interchangeably, and descriptions of gate G-A are applicable to gate G-B, and vice versa. Two magnitudes of gate A potential are shown, 2.0 V and 3.3 V, with a constant 0 V gate B potential. For 2.0 V gate A potential, surface potential is drawn with solid lines, and. is a somewhat idealized profile with relatively little potential migration left and right along the X-axis relative to location of the A gates G-A. Phantom lines are used to depict the 3.3 V gate G-A potential profile. With respect to the detectors shown in FIGS. 2A-2E, when gate potential VA is high, gate potential VB is low and vice versa. Depending upon the high or low state of gate potentials VA or VB, ideally substantially all charge would be collected by gates G-A (when VA=high, VB=low) or gates G-B (when VB=high, VA=low).

In FIG. 2A, consider the case of 2.0 V potential for gate G-A: Under this bias condition, charge-generated electrons under the gate G-B region are trapped. (The trapped electrons are depicted as encircled minus signs.) Trapping occurs because escape from this region requires the electrons to first overcome the potential barrier represented by solid line profile representing the 2 V bias. For the trapped electrons to migrate left or right in FIG. 2A requires overcoming regions of increasing negative potential, e.g., the solid line profile becomes more negative in the left or right direction. But this negative potential tends to repel the electrons, which remain trapped beneath the gate G-B region, as shown. A potential barrier as low as perhaps 100 mV will be sufficient to prevent electron migration as the thermal energy associated with the trapped electrons is insufficient to overcome this barrier. As a result, the electrons will remain trapped beneath the G-B regions, as shown in FIG. 2A.

The term modulation contrast (MC) denotes a measure of charge arrival time categorization efficiency, and does not refer to dark or light contrast of an image that may be acquired by Canesta, Inc. sensors or systems. High modulation contrast is desired for high performance sensor applications. But in a high modulation contrast application, it is desired to elevate gate potential G-A to a higherlevel, e.g., to 3.3 V rather than 2.0 V. But elevating gate potential G-A to 3.3 V causes the potential profile to take on the appearance represented in FIG. 2A by the phantom lines. Unfortunately the resultant potential barrier is insufficient to keep charge-generated electrons associated with (or trapped beneath) gate G-B from being attracted to gate G-A. Looking at the phantom line potential profile in FIG. 2A, migration of the trapped electrons laterally no longer requires Overcoming an increasingly negative potential profile; the profile is in fact increasingly positive, a condition favorable to movement of electrons. As a result, charge-generated electrons associated with gate G-B cannot be held (or trapped) in that region and will migrate to gate region G-A. An undesired result is that effective charge collection is impaired, and detector performance is degraded, which is to say modulation contrast decreases. Various factors affecting modulation contrast (MC) are described in the '454 patent. Generally modulation contrast has a maximum value of four (400%), with two or 200% being a more realizable value in actual TOF systems.

Note in the above example that the barrier that existed when gate potentials G-A=2.0 V and G-B=0 V disappeared when gate potential G-A was raised to 3.3 V. Conversely the voltage barrier that may exist at gate potentials G-A=3.3 V and G-B=1.0V will disappear when gate potential G-B is lowered to 0 V. One aspect of the '454 invention was directed to maintaining a potential barrier when the high magnitude of the gate potential is increased or the low magnitude of the gate potential is decreased. Operation of the detector system at these upper and lower extremes of gate potential is desirable in that detector performance is enhanced.

In the embodiment of the cross-sectional view shown in FIG. 2B, a sensor detector structure 140-1 is provided with implanted regions 600 that act as potential barriers. If one could see these implanted regions from the top of the detector substrate, they would appear to be longitudinal or finger-shaped, parallel and interleaved between adjacent finger-shaped polysilicon gates G-A, G-B. These potential barriers reduce migration of charge-generated electrons between adjacent finger-shaped gates, e.g., from G-A to G-B and vice versa. In the embodiment shown, structure 140-1 includes finger-shaped p+ doped regions 600 that act as an voltage barrier to undesired charge migration, even in the presence of large (e.g., 3.3 V) G-A gate potential. Further, barriers 600 advantageously reduce dark current that would be associated with other types of isolation barriers, e.g., shallow trench isolation, although in some applications shallow trench isolation may in fact be used.

Note in FIG. 2B that even at relatively high 3.3 V G-A gate potential and relatively low G-B gate potential, the presence of p+ regions 600 deepens the potential barrier between the interleaved finger-shaped G-A and G-B gate regions. The presence of the potential barrier advantageously enables detection-generated electron charge collected by gate G-B to remain trapped generally beneath the G-B region for a sufficiently long time to be collected, e.g., for a period of perhaps 100 μs to perhaps as long as a few ms. The charges trapped generally beneath the G-B region repel each other. This mutual repulsion results in the charges being collected at respective charge collection regions (see collector region 630, FIG. 2C) in the detector structure without any gate-induced horizontal electric field.

Advantageously, p+ doped implant regions 600 may be fabricated without need for critically controlled parameters such as magnitude of implant dosage and/or implant depth into substrate 110 of structure 140-1. Masking and doping steps used to create regions 600 may be shared with existing doping steps used elsewhere to fabricate overall structure 140-1.

As will now be described with reference to FIG. 2C, detection problems arise if charge ultimately collected at collection region 630 is drawn out by too high a gate potential at finger-shaped gate regions 620. FIG. 2C depicts structure 140-1 cut along a preferably polysilicon finger-shaped G-A gate 620. It is understood that if gate G-A potential (drawn in phantom line) is too high, a substantial number of electrons (shown as encircled minus signs) can be drawn out of n+ collection region 630 and into the region beneath gate G-A. In FIG. 2C, the G-A potential becomes more positive in the direction of G-A relative to region 630, which potential attracts the negatively charged electrons, as suggested by the left-pointing arrow. Electrons so drawn from the desired collection region into the G-A region may overwhelm the otherwise correct detection function of structure 140-1, as many of these electrons may be lost to G-B gate collection regions. What is needed here is a mechanism to prevent high G-A gate potential from drawing out charge collected in n+ collection region 630. Such a mechanism is provided in the embodiment of FIG. 2D, namely bias gate 640.

Turning now to FIG. 2D, a bias gate 640 has been added to structure 140-1 in FIG. 2C, to form an improved detector structure 140-1. Improved structure 140-1 reduces or prevents charge loss from the n+ collection regions to the gate regions, even in the presence of relatively high gate potential. In the embodiment of FIG. 2D, a bias potential VN+ of about 2.5 V is coupled to n+ collection region 630, and a bias potential VBG of perhaps 1.5 V is coupled to bias gate 640. The magnitude of bias potential VBG is sufficiently low relative to magnitude of bias potential VN+ such that charges collected in bias gate 640 region will be attracted to the N+ 630 region. At the same time, bias potential VBG is sufficiently high in magnitude such that region G-A collected charges will flow in the bias gate 640 region when the modulation clock signal at gate G-A 620 is low. Preferably spacing of bias gate 640 and polysilicon gate 620 is substantially as small as can be produced by the CMOS fabrication process used to create structure 140-1.

Also shown in FIG. 2D are potentials at the surface of silicon structure 1401. The VN+=2.5 V, V G-A=0 V voltage profile is a potential regime that encourages electrons collected or trapped beneath the G-A region to move to collection source region 630 without encountering a potential barrier. The VN+=2.5 V, V G-A=3.3 V voltage profile is a potential regime in which bias gate 640 provides a potential barrier that advantageously prevents electrons collected in N+ region 630 from being pulled into the region beneath gate G-A. Thus it is seen that providing appropriate VN and VG-A bias potentials to structure 140-1, charge loss can be minimized if not substantially eliminated.

In an alternate embodiment to structure 140-1 shown in FIG. 2D, bias gate 640 may be replaced with a light p doping. The light p doping region will create a potential barrier similar to that created and described above by bias gate 640. In short, such doping has the same effect of creating a potential barrier between gates G-A (respectively G-B) and collection source 630.

Turning now to the plan view of FIG. 2E, the detector structure shown includes bias gates 640, which improves charge collection characteristics. For ease of illustration, FIG. 2E does not depict the p doped barriers, and also depicting physical connections to the individual bias gates 640. Such connections are indicated symbolically as a heavy "wire", with encircled "x's" indicating electrical connection to the polysilicon associated with elongated or long finger-shaped gates G-A or G-B. Adjacent the distal ends of finger-shaped polysilicon gate structures G-A, G-B beneath the "x" denoted contacts are bias gate 640 and collection source 630.

Note that electrons collected by a source region 630 need not be captured by gate G-A (or G-B) during a common modulation cycle of G-A (or G-B) clock signal voltage. Such electrons might have been captured by a gate a period of time ago perhaps on the order of many microseconds (μs) or perhaps milliseconds (ms). Such electrons can linger in the substrate region beneath a gate for such lengths of time until ultimately being captured by an adjacent collection source region 630. According to some embodiments of the present invention, such electrons are induced to cross over to bias gate 640 as a result of two actions: the presence of relatively larger numbers of electrons accumulated under gate regions, and the repulsion effect between these electrons. The '454 patent describes various techniques to optimize the detector geometry including use of "T"-shaped gates G-A, G-B to enhance charge collection to increase length of the interface area between G-A (or G-B) gate regions, and bias gate 640. Techniques to reduce source capacitance and various masking techniques were also described.

Consider now FIGS. 3A-3B, taken from the '454 patent, where incoming optical energy is shown as zig-zag lines. FIGS. 3A and 3B are a cross-section of a sensor structure 240"-1, which may be used as sensor-detectors 140 in FIG. 1A, for collection of non-polycided gates at a high potential of 3.3 V. Within silicon substrate 410, field lines terminate on a gate G-A or on a gate G-B. In FIG. 3A gates G-A are at a high potential, perhaps 3.3V and gates G-B are at a low potential, perhaps 0V. In FIGS. 3A and 3B, the collection regions 480 for each of the two types of gates is shown pictorially in gray. The p+ barriers that were present in the structure of FIG. 2B are not shown in FIGS. 3A and 3B. As seen in FIG. 3A, gates G-A at the higher potential have larger collection areas. In practice the collection areas for G-A occupy substantially the entire area not occupied by the collection areas for gates G-B, however for ease of illustration, these enlarged collection area are depicted as regions confined to underneath gates G-A. Note that increasing magnitude of the gate potential of G-A increases the volume of these collection regions. It will be appreciated that the larger the collection region of gate G-A becomes, the smaller will become the collection region of gates G-B which, which are biased low at perhaps 0 V in FIG. 3A. This is because the volume of the collection regions for gates G-A compete for collection volume with the collection regions of gates G-B, which effective are compacted as the collection regions of gates G-A increase.

It is difficult to decrease the collection regions of gates G-B by lowering voltage magnitude of VB coupled to G-B. This is because decreasing VB to too low a level may cause gates G-B to lose already collected charges, a regime of operation that is to be avoided. However increasing the VA voltages on gates G-A reduces the collection regions of gates G-B in a more controlled fashion, and is a preferred manner of increasing the ratio of the collection region of gates G-A to the collection region of gates G-B, when VA is high, and VB is low. This increase in the ratio advantageously increases modulation contrast, and hence performance of the TOF system. High modulation contrast is always desired and embodiments of the '454 patent achieved high modulation contrast, using standard 0 V to 3.3 V swings common for 0.18 um devices. As will be described later herein, embodiments of the present invention achieve high modulation contrast, but advantageously using lower voltage swings. FIG. 3B is similar to FIG. 3A but depicts the complementary case when VB is high potential, perhaps 3.3 V, and thus collection regions 480 generally beneath gates G-B are large, and VA is at low potential, e.g., about 0 V, and collection regions beneath gates G-A are small.

In forming detector structures as described earlier herein, it is preferred that if a lightly doped p substrate 110 is used (dopant concentration of about $5 \cdot 10^{14}/cm^3$) then a spaced-apart distance between adjacent finger-shaped gates G-A, G-B of about 0.5 μm to 2 μm can be realized. Following fabrication, suitable bias voltages for the n+ regions, high and low magnitudes for G-A and G-B clock voltages, and bias gate potentials will be determined. Desired operating voltages may be determined by sweeping these potentials and comparing relative detector performance for all swept operating points, and maintaining the best bias regime configurations. It is preferred that a relatively thick oxide on the order of 50 Å be employed to protect gate oxides from damage due to high gate potentials, including potential magnitudes not likely to be encountered in normal substrate operation. While various embodiments of the present invention have been described with respect to a p substrate 110, it is understood that an n substrate could instead be used, or even an n well or a p well, providing doping levels are acceptable low for all modulation regimes.

Thus in CMOS detectors useable with TOF systems, there is a need for a detector structure that collects charge efficiently maintains or preferably enhances high modulation contrast, and can achieve these goals with relatively low voltage transitions. Further there is a need for a detector structure with reduced inter-gate capacitance.

The present invention provides CMOS detectors having (especially short collection time detectors) with a mechanism to manage and maximize collection of useful photocharge, while minimizing collection of not useful late arriving charge. The overall result is to enhance accuracy of depth data acquired by TOF systems.

SUMMARY OF THE INVENTION

The present invention proves three-dimensional CMOS sensors in which adjacent gates need not be in close proximity to function. As distance between adjacent gates increases, inter-gate capacitance decreases, as do mal-effects of such capacitance upon detection power consumption. Embodiments of the present invention eliminate the barrier regions implanted between adjacent elongated finger-like gates, as described in the '454 patent. Instead, elongated finger-like p+ regions are implanted beneath the gates, preferably before the polysilicon gates are created. Alternatively, elongated finger-like p+ regions are implanted adjacent but slightly overlapping the edges of the gates, preferably after the polysilicon gates are formed. If desired, both p+ region types may be used simultaneously.

The p+ regions associated with gates coupled to low gate potential create electric fields to repel charge (electrons), which charge is then steered to the nearest gate coupled to high gate potential. In this fashion essentially all of the released charge present in the collection region of interest in the substrate is collected by the desired gates. One result is that modulation contrast is substantially improved as there is substantially full depletion in the region beneath gates coupled to low gate potential, and no random movement of charge occurs in these regions. In some embodiments, modulation contrast is improved so substantially that a gate can be used to create an electronic shutter for various applications. In such applications, when the gate potential is low the shutter is closed, and when the gate potential is high the shutter is open and the gate collects light.

Other features and advantages of the invention will appear from the following description in which the preferred embodiments have been set forth in detail, in connection with their accompanying drawings.

DETAILED DESCRIPTION OF THE INVENTION

Figure 1A:
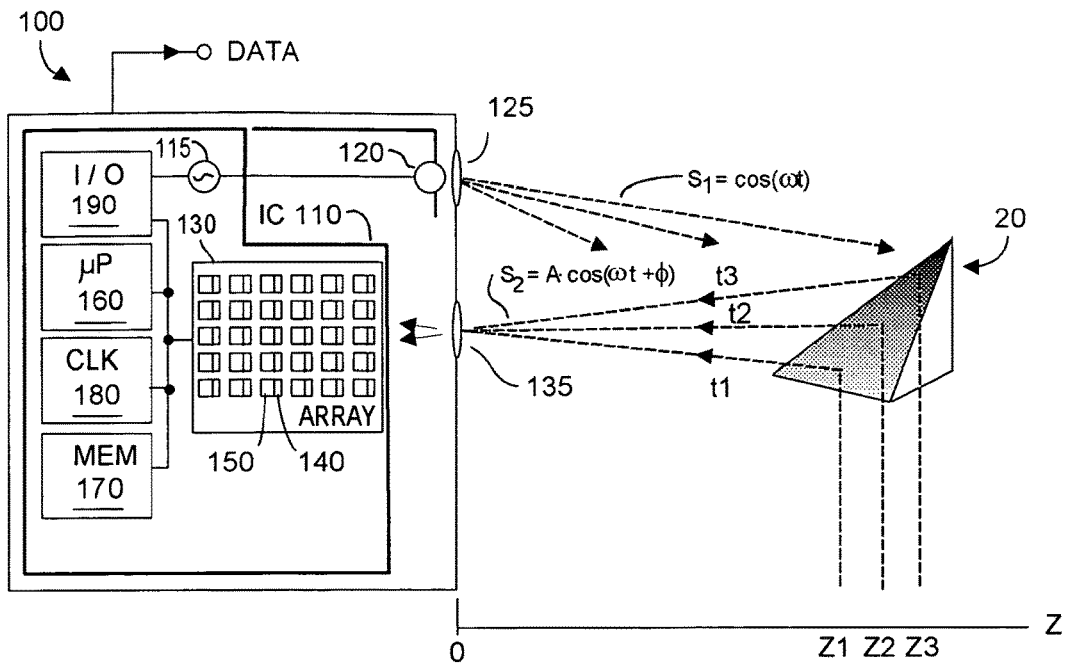
FIG. 1A depicts an exemplary phase-based TOF system according to the '454 patent, with which the present invention may be practiced.
Figure 1B:
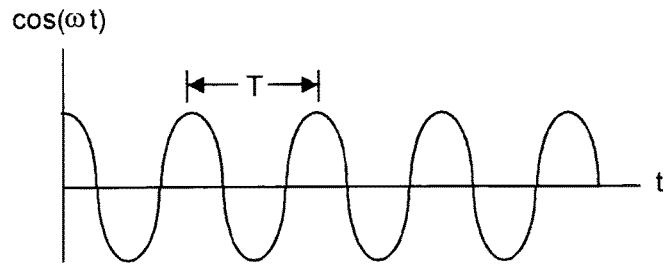
FIG. 1B depicts a transmitted periodic signal with high frequency components transmitted by the system of FIG. 1A, according to the '454 patent.
Figure 1C:
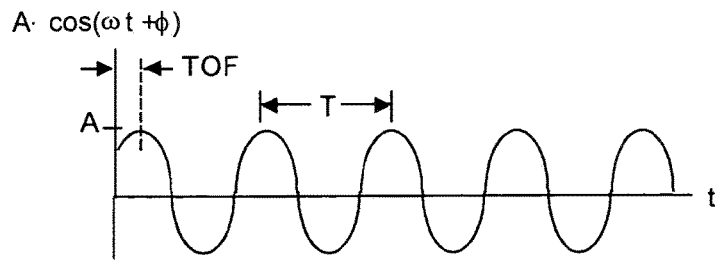
FIG. 1C depicts the return waveform with phase-delay for the transmitted signal of FIG. 1B, according to the '454 patent.

Embodiments of the present invention may be practiced with phase-based TOF systems such as depicted in FIG. 1A as exemplified by numerous U.S. patents to Canesta, Inc., include U.S. Pat. No. 7,352,454 (2008) or with non-phase based systems, e.g., as described in U.S. Pat. No. 6,323,942 (2001), assigned to Canesta, Inc. Embodiments of the present invention to improve collection of photocharge whose creation time is known, and to impede collection of photocharge whose creation time is not known (i.e., late arriving charge) can be implemented by modifying the structure of sensors 140 in FIG. 1A. Of course the present invention may be used with other sensors and may be used in non-TOF applications.

Sensors as described with respect to FIG. 1A, modeled on the '454 patent, thus are a good starting point. To recapitulate the description of the '454 sensors, the sensor structures included finger-shaped gate structures that extended along a y-axis, and were spaced-apart from each other a relatively short distance along the x-axis. Source collection regions were disposed adjacent distal ends of an associated elongated gate structure. Performance was determined more by the smaller x-dimensions than by the larger y-dimensions. Performance is characterized by high x-axis electric fields and rapid charge movement, as contrasted with lower y-axis electric fields and slower charge movement. Further performance enhancement resulted from implanting a potential barrier between adjacent gates and by forming a bias gate intermediate distal ends of the elongated gates and an associated source region. The resultant detector structures are operable at the more extreme gate voltages that are desirable for high performance and high contrast modulation.

Embodiments of the present invention will now be described, commencing with reference to FIG. 4A. In general, the quality of depth Z data captured by CMOS three-dimensional detectors is a function of several factors, including efficiency of charge generation, efficiency of charge collection, and especially speed of charge collection. A scene to be acquired by a system that includes a three dimensional detector sensor will cause incoming photon energy to release electrons (or charge) within the detector substrate. Referring back to FIGS. 2A-2D, depending upon the high or low state of gate potentials VA or VB, ideally all charge would be collected by gates G-A (when VA=high, VB=low) or gates G-B (when VB=high, VA=low). The elongated finger-like gate structures G-A, G-B best seen in FIG. 2E had to be in close proximity to each other to influence each other's ability to collect charge when the charge collecting gates were biased high. This requirement for close proximity had the undesired effect of increase inter-gate capacitance, which degraded performance of the overall detector. Further, implant barrier regions were required midway between adjacent gates. These barriers were intended to retard inter-gate charge transfer, but at the substrate surface tended to degrade modulation contrast substantially especially for photocharges created near the surface. Nonetheless detector structures such as shown in FIGS. 2A-2E represented a substantial improvement over earlier detector structures, but room for further improvement remained.

In the embodiments of FIGS. 2A-2E, when gate voltage VA was high, gates G-A created an electric field having a substantial region of influence and most of the charges (freed electrons) in the detector substrate generated by incoming optical energy moved towards gates G-A. By the same token, when gate voltage VB was high, gates G-A created an electric field having a substantial region of influence and most of the charges moved towards gates G-B. But having "most" of the charges collected by the desired gates coupled to high gate potential meant many charges went instead to the remaining gates coupled to low gate potential.

Figure 3A:
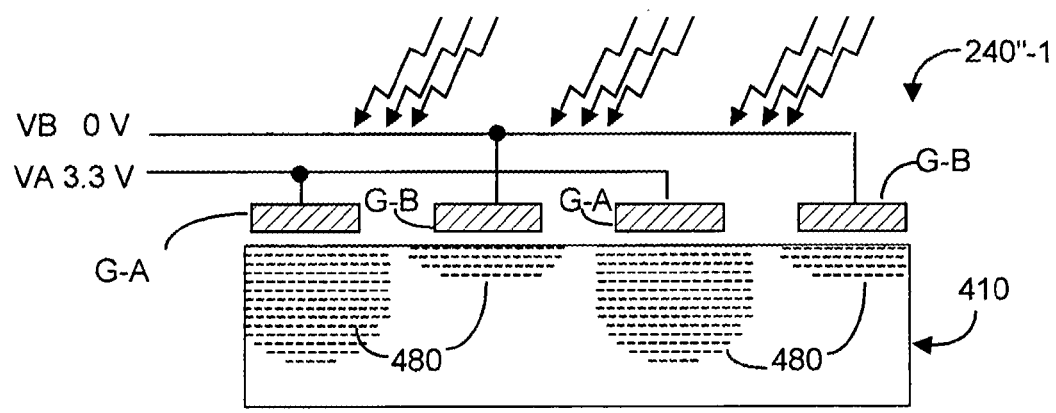
FIGS. 3A and 3B are cross-sections of sensor detector structures showing variable-depth depletion regions and variable wavelength detection characteristics, according to embodiments of the '454 patent, and useable with embodiments of the present invention.
Figure 3B:
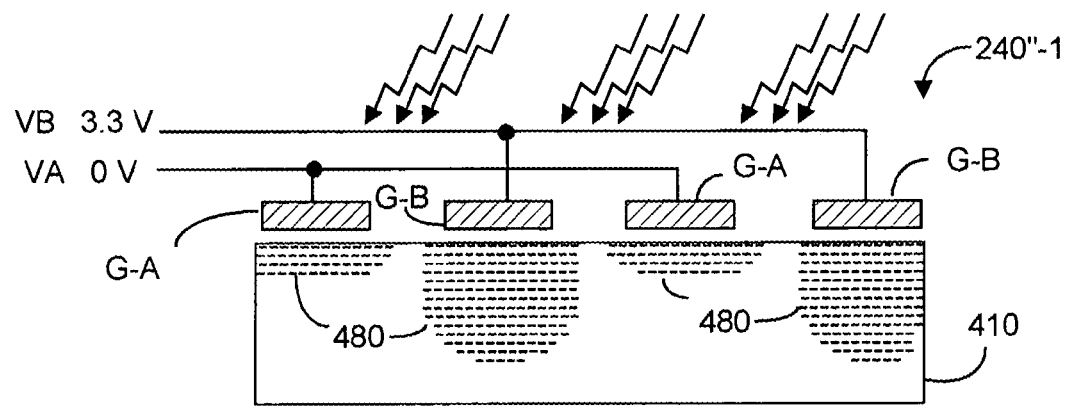

As best seen in FIGS. 3A and 3B, taken from the '454 patent, the magnitude of charges going to the wrong gates (e.g., gates coupled to VA=low or VB=low) might be on the order of perhaps 20% to perhaps 25%, a level of mis-collection that is not negligible. The mis-collection contributes to error in detection data in several ways. Error results because less desired charge is collected by the gates coupled to high gate potential. Error also results because the mis-collected charge goes to the gates coupled to the low potential and thus counts twice to a reduction in the difference between charge at each of gates G-A and G-B. Note in FIGS. 3A and 3B that the three-dimensional shape of the collection regions, especially collection regions with correspondingly low gate voltages, is influenced by the gates with high potential. For example, in FIG. 3A the collection region for gate B (G-B) is squeezed out by the larger collection region for gate A (G-A). Thus, again, it will be appreciated that the collection region for G-B, in this example, is heavily influenced by the gate voltage for G-A; as well as the gate voltage for G-B.

Figure 2A:
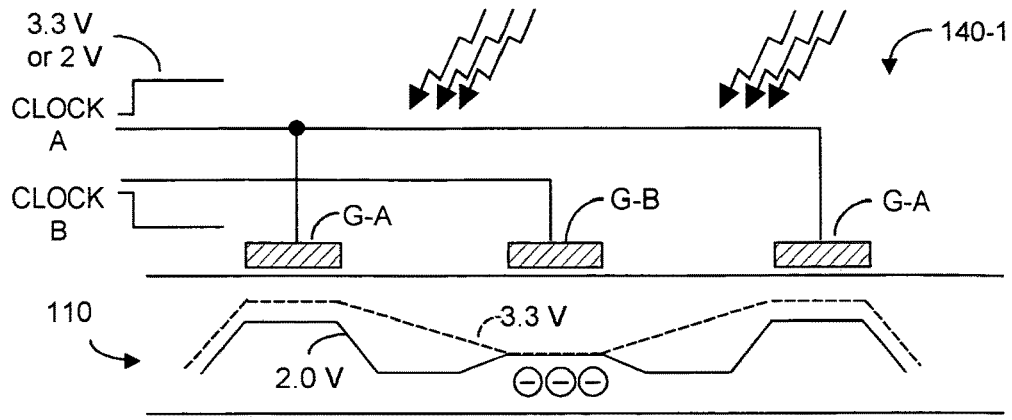
FIG. 2A is a cross-section of a sensor detector structure with a plot of surface potential at the silicon-gate oxide interface versus position along the X-direction, depicting undesired effects of high gate potential upon charge collection in an embodiment according to the '454 patent.
Figure 2B:
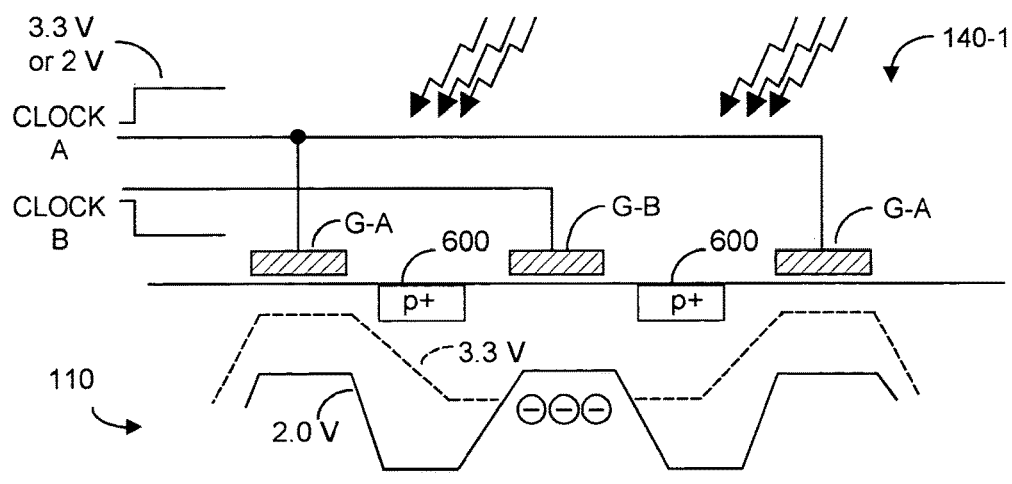
FIG. 2B is a cross-section of a sensor detector structure with a plot of surface potential at the silicon-gate oxide interface versus position along the X-direction, depicting enhanced high gate potential robustness of a detector structure provided with implanted barrier regions, according to embodiments of the '454 patent, and useable with embodiments of the present invention.
Figure 2C:
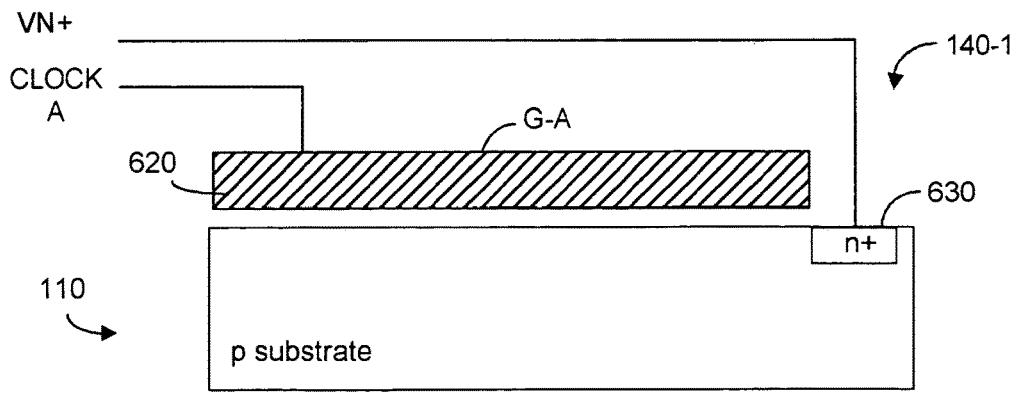
FIG. 2C is a cross-sectional view of a sensor detector structure along a finger-shaped collection G-A gate depicting loss of charge from the collector region to the G-A region if gate potential is too high absent structure modification according to an embodiment of the '454 patent.
Figure 2D:
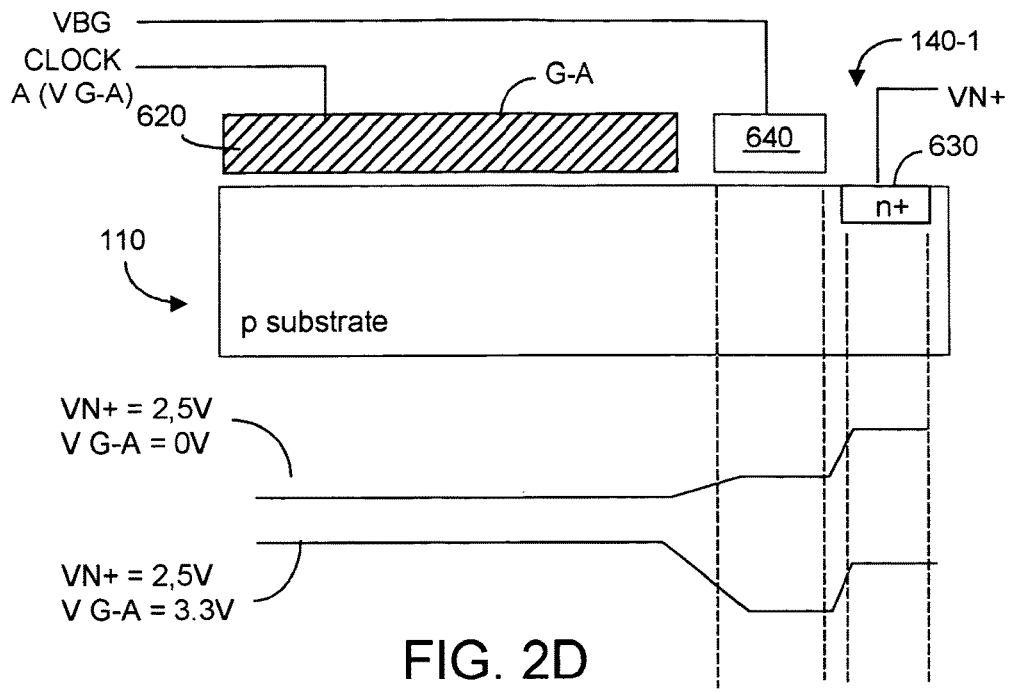
FIG. 2D is a cross-sectional view of the structure of FIG. 2C, modified to include a bias gate region to reduce loss of collected charge, and depicting surface potentials, according to embodiments of the '454 patent, and useable with embodiments of the present invention.
Figure 2E:
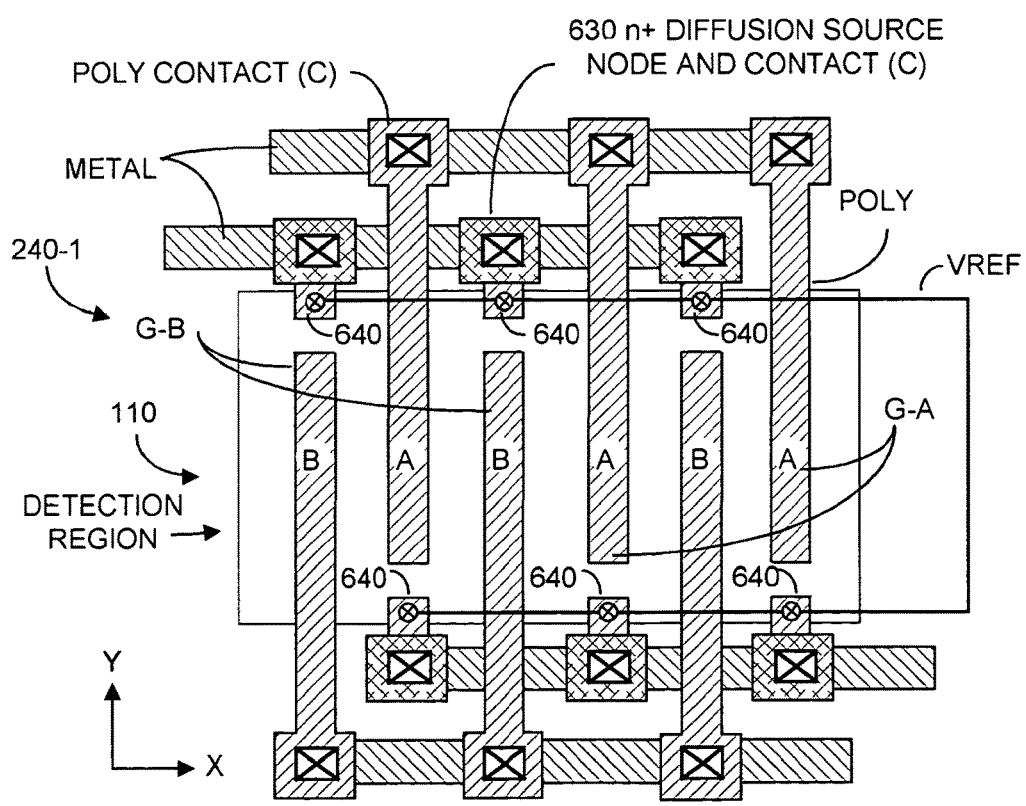
FIG. 2E is a plan view of a detector structure that includes bias gates, according to an embodiment of the '454 patent.

Referring back to the embodiments shown in FIG. 2B, the regions of influence generated by gates G-A require the presence of gates G-B, and vice versa. This is especially true for the region of low gate voltage that is reduced due to the presence on both sides of a gate coupled to high gate voltage. Unfortunately, however, the symmetry presented by alternating gates G-A, G-B, G-A, G-B, etc. is lost for the outmost gates in the structure, which degraded modulation contrast. For example if gate B is low then looking at FIG. 2E, the leftmost gate G-B lacks a gate G-A to its left, and the rightmost gate G-A lacks a gate G-B to its right. This asymmetry at the ends of the structure meant that charges collected by the leftmost gate G-B and by the rightmost gate G-A represented data inferior in quality to data collected by the other gates in the structure that enjoyed gate symmetry, e.g., gates G-A on each side of each gate G-B and vice versa. As such, modulation contrast was adversely affected especially for gates with a small number of elongated fingers as would be required for small pixels.

It will be recalled that to reduce the transfer of charge between adjacent gates G-A and G-B (and vice versa), the structures shown in FIGS. 2A-2E required finger-shaped p+ implanted barrier regions (e.g., regions 600 in FIG. 2B) midway between adjacent gates, which gates required close proximity to each other. These regions blocked transfer of electrons from regions under gates G-B to gates G-A when potential VA was high, and blocked electron transfer from regions under gates G-A to gates G-B when potential VB was high. Independently of voltages VA or VB, these barriers created a static blocking influence at the upper surface of substrate 410, with geometry more than bias voltages contributing to their barrier effect. Modulation contrast was advantageously more dependent on voltages deeper in the silicon substrate, but since substantially all useful photocharge collection occurs in the top 5 μm to 8 μm overall modulation contrast suffered.

Figure 4A:
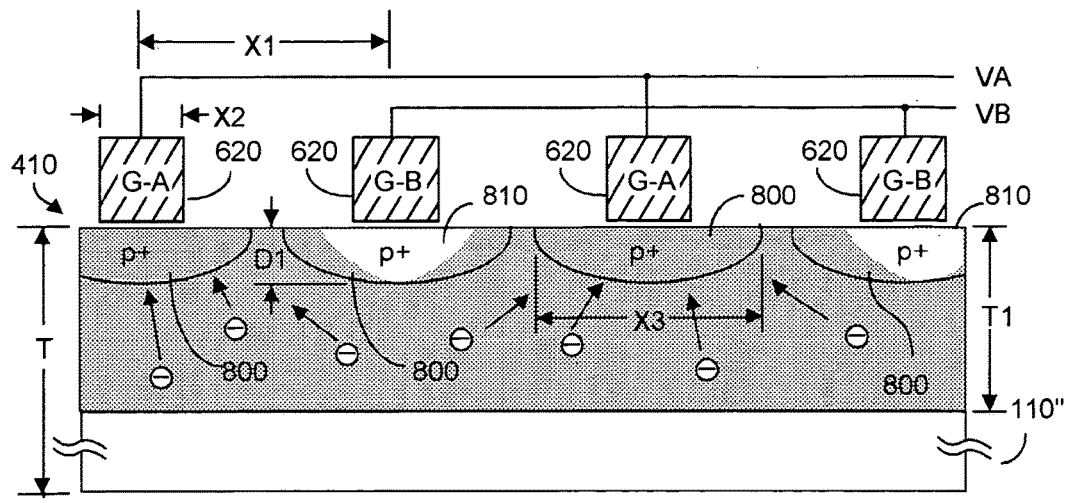
FIG. 4A is a simplified cross-sectional view of a CMOS sensor detector structure depicting collection charge steering when VA=high, VB=low, due to p+ regions preferably created before formation of gates G-A, G-B, according to an embodiment of the present invention.
Figure 4B:
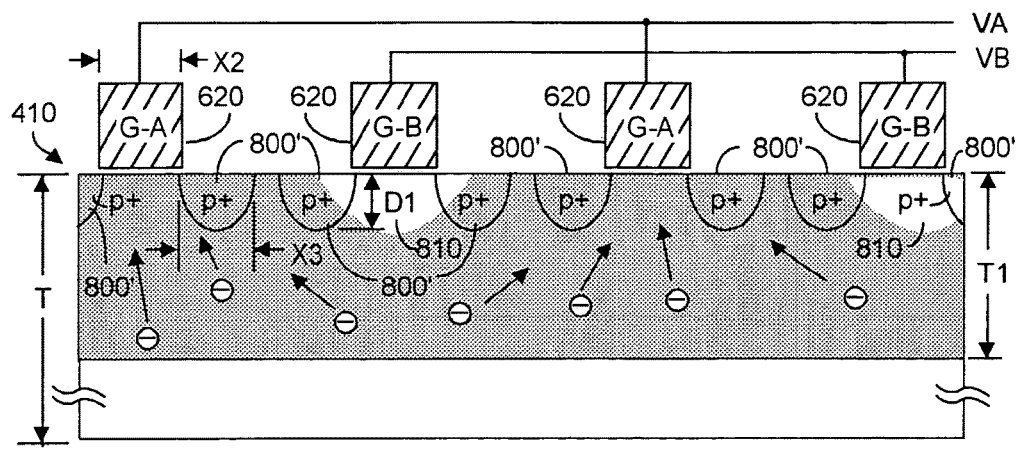
FIG. 4B is a simplified cross-sectional view of a CMOS sensor detector structure depicting collection charge steering when VA=high, VB=low, due to p+ regions preferably created after formation of gates G-A, G-B, according to an embodiment of the present invention.
Figure 5:
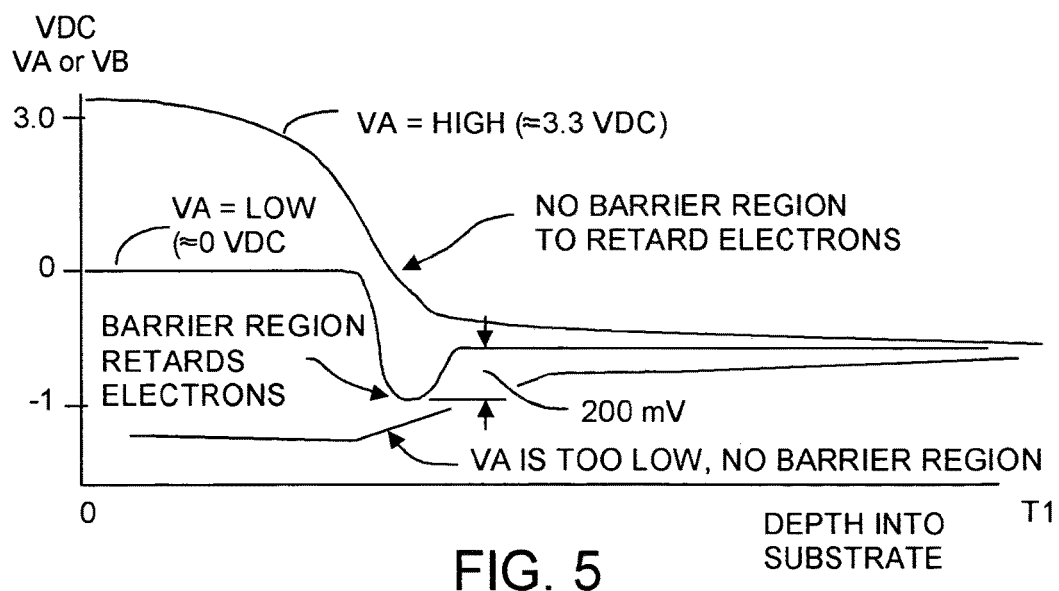
FIG. 5 depicts electric field profiles present in embodiments of FIG. 4A and 4B, for one of gate G-A or gate G-B, showing two desirable and one undesirable operating regime, according to embodiments of the present invention.

Consider now the improved CMOS detector structure provided by embodiments of the present invention, exemplified by FIGS. 4A, 4B, and 5. It is understood that these figures are simplified for ease of depiction, are not scaled, and do not show all surface structure details. Note in FIGS. 4A and 4B the absence of barrier regions 600 that were required in the configuration of FIG. 2B. This inter-gate spacing is greater (perhaps about 1.2 μm) than what was tolerable in the prior art. This results because the collection region for the gate with the low voltage need not be confined by the collection region for the gate with higher voltages. Consequently in the embodiments of FIGS. 4A and 4B, capacitance between adjacent gates G-A and G-B is advantageously reduced. Another advantage of the present invention is that the requirement for symmetry for all gates to properly collect charge is removed. It will be recalled that at the end of a row of gates in the prior art, there would always be a gate G-A (or G-B) that was not midway between two other gates G-B (or G-A).

Referring now to the embodiments shown in FIGS. 4A and 4B, note the presence of p+ dopant regions 800 beneath and overlapping each gate structure 620. In FIG. 4A, if the width X2 of each elongated gate is about 0.2 µm, then the surface width X3 of each p+ implant region 800 is about three times greater or about 0.6 µm. The depth D1 of each region 800 is on the order of about 0.1 µm. An exemplary dopant concentration of each region 800 is typically on the order of about $1 \times 10^{17}/cm^3$ or less, although other concentrations could of course be used. If seen in plan view, these p+ regions would appear as elongated and finger-like, similar to the overlying gate structures G-A, G-B. In the embodiment of FIG. 4A, p+ regions 800 preferably are deposited before formation of the polysilicon gate structures G-A, G-B.

In FIGS. 4A and 4B, the overall thickness T of preferably p-type substrate 410 is perhaps 300 µm, and the collection depth of primary interest near the substrate surface has depth T1 of perhaps 5 µm to 8 µm typically in a low doped epi region at the silicon surface. While incoming photon energy will release charges (electrons) deeper into the substrate than depth T1, as a practical matter the charge of interest to be collected by gates G-A and G-B will be found in the first 5 µm to 8 µm or so of the substrate depth.

The detector embodiment of FIGS. 4A and 4B functions as follows. FIG. 4A depicts the condition when gate potential VA is high (perhaps about +3.3 VDC) and potential VB is low (perhaps about 0 VDC). The high VA potential on polysilicon gates G-A overcomes the repulsive effect of the p+ region 800 beneath it and attracts electrons (shown as encircled minus signs) towards the nearest gate G-A. During this time, p+ regions 800 create a potential barrier generally beneath gates G-B, whose gate potential VB is low and cannot overcome the barrier. This electric field barrier is shown as white colored regions 810 generally beneath the low voltage biased gates, here G-B, which steer electrons away from regions 800. By contrast the gray-colored upper substrate region in FIG. 4A represents the region of influence created by gates G-A, whose bias potential VA is high, from which electrons can be collected. When bias potential VB is high, the gray area in FIG. 4A (and FIG. 4B) would look similar to what is shown in the figures except that the white colored regions 810 would now appear beneath gates G-A.

Note that when gate G-B potential is low, electrons collected previously when gate G-B was high will still be retained beneath gate G-B. This is because the attractive voltage from gate G-B (even at 0 V) immediately beneath G-B is still higher than the repulsive force from p+ region 800. However this statement is correct essentially only at the very surface of the silicon beneath gate G-B. Within region 800 but below the immediate silicon surface, the repulsive effect of the p+ takes over and any photocharges are swept out of this region. This is described in more detail with respect to FIG. 5.

In FIG. 4A, the negative charges (electrons) are thus attracted almost exclusively to the relatively high positive potential on gates G-A. As suggested by the large volume of the gray colored region in this figure, substantially all of the charge in the substrate collection region of interest (e.g., within substrate depth T1) is steered toward and collected by gates G-A. The volume of this gray region is substantially greater than the area of collection associated with the embodiments of FIG. 3A, for which an effective collection of perhaps 75% of charge was available. More importantly, the volume of the charges going to G-B is much lower than in embodiments of FIG. 3B. Referring again to FIG. 4A, when the gate potentials are changed to VA low and VB high, white regions 810 will now be found generally beneath gates G-A, and substantially the entire upper substrate collection region of interest will be influenced by the high potential on gates G-B. Note that the asymmetry problem associated with structures such as that shown in FIG. 2B is overcome in that individual gates G-A can function without requiring a gate G-B on either side, and vice versa. Note too that the very distinguishable, almost digital, charge collection regimes, e.g., collect charge or do not collect charge, enhances the modulation contrast of the detector of FIG. 4A and FIG. 4B, as described later herein. The white colored barrier regions 810 beneath the low VB biased gates G-B represent the collection areas for gate G-B, and are almost negligible as compared to the collection areas for gate G-A. Note too that the action of the p+ regions essentially causes each gate G-A, G-B to be self-sealing (when its gate potential is low) with respect to not adversely affecting charge collection by the other gate (whose gate potential is high). This self sealing mechanism can be used advantageously in applications requiring an electronic shutter with low KT/C noise. When the potential on a gate is low, the shutter is closed and does not collect charge. However when the gate potential is high, the shutter is open and the gate collects photocharges.

The simplified detector embodiment of FIG. 4B functions similarly to the embodiment of FIG. 4A, and is depicted for the case VA=high, VB=low. However in this embodiment, p+ regions 800' are preferably deposited after formation of the polysilicon gates G-A, G-B, and are deposited adjacent the edges of the gate structures. Because the fingers are very narrow, the electrical fields of the p+ regions flanking the gates seal off entry to the gate and provide a potential barrier in the same fashion as in the method of FIG. 3A. The deposition depth D1 is again about 0.1 µm, deposition width X3 at the surface is about 0.2 µm, and an exemplary doping regime is again about $1 \times 10^{17}/cm^3$, although other doping concentrations could be used. If seen in plan view, p+ structures 800' would appear as elongated and fingerlike, similar to the elongated finger-like gate structures G-A, G-B to which they are adjacent (and slightly overlap). Charge collection for the detector embodiment of FIG. 4B is similar to what has been described with respect to FIG. 4A. Thus, the white regions 810' under gates G-B represent regions of charge collection for gate G-B, while the gray colored region of the upper substrate of interest represents the volume from which gates G-A collect charge (since VA=high, VB=low). Again, the asymmetry problem associated with structures such as that shown in FIG. 3B is overcome in that individual gates G-A can function without requiring a gate G-B on either side, and vice versa.

If desired, a detector such as shown (in simplified form) in FIGS. 3A and 3B could be formed using p+ doped regions formed before and formed after formation of the polysilicon gates. This would advantageously allow further flexibility in the design and implementation of the detector in that the designer would have more parameters to vary during fabrication.

Additional understanding of the role of p+ regions 800 in FIG. 4A and FIG. 4B follows from consideration of FIG. 5. The effective barriers created by the p+ doped regions 800 and between the doping regions shown in FIG. 4B are shown in FIG. 5 as a "kink" or barrier of perhaps 200 mV magnitude in the VA=low profile. Since the average thermal energy potential for an electron (or charge) is only about 25 mV, relatively few electrons will possess sufficient thermal energy to overcome this 200 mV barrier.

Functioning of detector structures according to the present invention as exemplified by FIGS. 4A and 4B will now be described with respect to FIG. 5. FIG. 5 depicts profiles for one of gate G-A or gate G-B, and depicts three possible operating regimes, depending upon the voltage VA (or VB).

Assume FIG. 5 depicts operation of gate G-A. In a desirable middle mode regime, let VA be about 0 V. With VA=0 V, white regions 810 associated with the low biased gates will be created beneath gate G-A, as will an electric barrier field. Gate G-A will continue to hold charges it has already collected as these charges would have to overcome the perhaps 200 mV barrier to leave this gate, which barrier prevent additional charges from reaching G-A. Thus in this middle regime, gate G-A retains previously collected charges, but will not receive additional charges.

In a desirable high regime, gate G-A is biased high to perhaps 3 V, and as shown in FIG. 5, the barrier disappears, charge collection now occurs, and charges can be collected from the gate.

A third, undesirable regime, is indicated in the bottom portion of FIG. 5, where VA is too low and no barrier region exists. In this undesirable mode, gate G-B cannot retain its collected charges.

It will be appreciated from the foregoing that detectors according to the present invention may advantageously be used in a low voltage swing configuration. Such a configuration is beneficial because IC chip, e.g., IC 110, clock power is proportional to $CV^2$, where C is capacitance and V is voltage swing, and thus power is significantly reduced with reduced voltage swings. In prior art detectors such as described in '454 modulation contrast may decrease with reduced voltage swing. This is because reducing the high voltage for G-A reduces the confinement of the collection region for G-B. The resulting increase in collection area of G-B decreases modulation contrast.

By contrast, in the present invention collection of photocharges by a gate G-A or G-B may be switched abruptly on or off depending whether the gate is in the charge collecting regime or the charge holding regime. A change between these two desirable regimes may be affected with a relatively modest change in the voltage to one of the gates, say a change of about 1 V. It will be appreciated that the collection area of a gate, e.g., G-A, during a charge holding regime is relatively small and substantially independent of VA and VB, provided that magnitude of VA is sufficiently low to create the barrier. Thus modulation contrast (especially at low modulation frequencies) is advantageously substantially independent of voltage swing.

Reviewing the above with respect to FIGS. 4A and 4B, when VA is high, e.g., perhaps 3 V, electrons in the upper substrate collection region of interest (e.g., T1≤about 8 μm) are steered by virtue of the barrier to gates G-A. Of course when potential VB is high (and potential VA is low), gates G-B collect substantially all of the electrons. This high regime as VA is perhaps 3 V results in disappearance of the "kink" in FIG. 5, representing the barrier to electrons. But in the low regime, when VA approaches 0 V, the kink and resultant barrier exist. But in the too low regime that is to be avoided, gates release or lose already collected charges. Good circuit design seeks to provide a detector for which VA or VB high is about +3.3 VDC, and for which VA or VB low (e.g., kink present) is about 0 VDC.

To recapitulate, embodiments of the present invention as described in connection with FIGS. 4A, 4B and 5 offer improvements over prior art detectors. The prior art requirement for closely spaced gates is overcome by using implanted p+ regions that act as barriers that can be overcome by application of high gate voltages. There is now more flexibility in locating the gates, which can be spaced wider apart than in the prior art, with advantageous reduction in inter-gate capacitance. Thus in many applications, the design engineer enjoys more flexibility in laying out detectors according to the present invention in that close inter-gate spacing requirements are avoided.

Modulation contrast is improved because charge collection efficiency is substantially enhanced because the asymmetry required for charge collection in prior art detectors is no longer a factor. Also the effective collection area for the gate whose voltage is slow is significantly reduced, which improves modulation contrast.

While Canesta, Inc.'s various detectors have been described primarily for use with three-dimensional sensor systems, those skilled in the art will appreciate that detectors and indeed other devices can benefit from what has been described. Because collection by an elongated finger-like gate can be turned-on and turned-off without the use of a switch (e.g., a MOSFET), there is no KT/C noise when the gate (acting like a shutter) is turned-off or turned-on. Thus, the configurations of FIGS. 4A and 3B could be used to provide a very fast (picosecond range) electronic shutter with little or no KT/C noise. In other applications, detection systems can be fabricated using peak and average optical emitter power in the tens or hundreds of mW range, while still maintaining cm range distance resolution, improved modulation contrast, and good signal/noise ratios.

Modifications and variations may be made to the disclosed embodiments without departing from the subject and spirit of the invention as defined by the following claims.

What is claimed is:

1. An electro-optical device comprising:
   a doped semiconductor body having a gate-supporting surface and a first doped region extending below the gate-supporting surface and being doped to repel photocharges, the semiconductor body being structured to receive and absorb photons and to produce corresponding photocharges including photocharges emanating from below the first doped region and migrating toward the gate-supporting surface;
   a first gate disposed to overlap the first doped region, a combination of the first gate and the overlapped first doped region being structured to induce formation of a first potential barrier of variable magnitude located between the gate-supporting surface and a substrate-facing side of the first doped region when a corresponding first biasing signal is applied at the first gate, the first potential barrier being variable to at least have a first state in which the first potential barrier inhibits the photocharges emanating from below the first doped region and migrating toward the gate-supporting surface from reaching a first photocharge collection region, the first photocharge collection region being adjacent to the gate-supporting surface and being overlapped by the first gate, and the first potential barrier being variable to also at least a second state in which the first potential barrier allows the photocharges emanating from below the first doped region and migrating toward the top surface to reach the first photocharge collection region.

2. The electro-optical device of claim 1 wherein the first potential barrier in the first state has a magnitude greater than 25 millivolts.

3. The electro-optical device of claim 2 wherein the first potential barrier in the first state has a magnitude of at least 100 millivolts.

4. The electro-optical device of claim 3 wherein the first potential barrier in the first state has a magnitude of about 200 millivolts.

5. The electro-optical device of claim 1 wherein the first potential barrier in the second state has a magnitude less than 25 millivolts.

6. The electro-optical device of claim 1 wherein the produced photocharges include photocharges emanating from a first depth T1 greater than a maximum depth D1 of the first doped region.

7. The electro-optical device of claim 1 wherein the maximum depth D1 of the first doped region is about 0.1 micrometers.

8. The electro-optical device of claim 1 wherein the corresponding first biasing signal applied at the first gate for inducing the first potential barrier having the first state is in a range of about 0 to −0.7 volts.

9. The electro-optical device of claim 8 wherein the corresponding first biasing signal applied at the first gate for inducing the first potential barrier having the second state is in the range of +1 volt to about +3.3 volts.

10. The electro-optical device of claim 8 wherein a bulk of the doped semiconductor body has a p-conductivity and the first doped region has a p+ conductivity.

11. The electro-optical device of claim 1 wherein the first potential barrier in the first state additionally inhibits photocharges that have collected in the first photocharge collection region from migrating out of the first photocharge collection region.

12. The electro-optical device of claim 1 wherein the first potential barrier is variable to at least have a third state in which the first potential barrier causes both photocharges that have collected in the first photocharge collection region and photocharges emanating from below the first doped region and migrating toward the first photocharge collection region to move away from the first photocharge collection region.

13. The electro-optical device of claim 12 wherein the corresponding first biasing signal applied at the first gate for inducing the first potential barrier having the third state is less than 0 volts.

14. The electro-optical device of claim 1 further comprising:
a second photocharge collection region, adjacent to the gate-supporting surface and spaced apart from the first photocharge collection region;
wherein the first potential barrier in the first state operates to steer photocharges emanating from below the first doped region and migrating upwards in direction of the first photocharge collection region away from the first photocharge collection region and instead towards the second photocharge collection region.

15. The electro-optical device of claim 1 further comprising:
a second gate spaced apart from the first gate and disposed to overlap a second doped region extending within the semiconductor body, the second doped region being doped to repel photocharges, where a combination of the second gate and the overlapped second doped region are structured to induce formation of a second potential barrier of variable magnitude located between the gate-supporting surface and a substrate-facing side of the second doped region when a corresponding second biasing signal is applied at the second gate, the second potential barrier being variable to at least have a respective first state in which the second potential barrier inhibits photocharges emanating from below the second doped region and migrating toward a second photocharge collection region disposed under the second gate from reaching the second photocharge collection region, the second photocharge collection region being adjacent to the gate-supporting surface and being overlapped by the second gate, and the second potential barrier being variable to also have a respective second state in which the second potential barrier allows at least the photocharges emanating from below the second doped region and migrating toward the second photocharge collection region to reach the second photocharge collection region.

16. The electro-optical device of claim 15 wherein the second potential barrier in the respective first state additionally inhibits photocharges that have collected in the second photocharge collection region from migrating out of the second photocharge collection region.

17. The electro-optical device of claim 15 wherein the second potential barrier in the respective first state has a magnitude greater than 25 millivolts.

18. The electro-optical device of claim 15 wherein the second potential barrier is variable to have a respective third state in which the second potential barrier causes both photocharges that have collected in the second photocharge collection region and photocharges emanating from below the second doped region and heading to the second photocharge collection region to move away from the second photocharge collection region.

19. The electro-optical device of claim 15 wherein the respective first and second biasing signals are differentially applied to the first and second gates, respectively, such that when the first potential barrier is in the first state, the second potential barrier is in the respective second state, and such that when the first potential barrier is in the second state, the second potential barrier is in the respective first state.

20. The electro-optical device of claim 19 wherein when the first potential barrier is in the first state and the second potential barrier is in the respective second state, photocharges emanating from below the first doped region toward the first photocharge collection region are redirected to the second photocharge collection region.

21. The electro-optical device of claim 20 wherein when the first potential barrier is in the second state and the second potential barrier is in the respective first state, photocharges emanating from below the second doped region toward the second photocharge collection region are redirected to the first photocharge collection region.

22. The electro-optical device of claim 15 wherein:
the top surface of the doped semiconductor body is subdivided into a plurality of pixel areas; and
the first and second gates are disposed within a same pixel area among said plurality of pixel areas.

23. The electro-optical device of claim 15 wherein the first and second gates are spaced apart from one another and have a center-to-center lateral spacing distance greater than a lateral width of the first doped region.

* * * * *